(12) United States Patent
Nakamura et al.

(10) Patent No.: US 8,246,744 B2
(45) Date of Patent: Aug. 21, 2012

(54) METHOD FOR PREDICTING PRECIPITATION BEHAVIOR OF OXYGEN IN SILICON SINGLE CRYSTAL, METHOD FOR DETERMINING PRODUCTION PARAMETER OF SILICON SINGLE CRYSTAL, AND STORAGE MEDIUM FOR STORING PROGRAM FOR PREDICTING PRECIPITATION BEHAVIOR OF OXYGEN IN SILICON SINGLE CRYSTAL

(75) Inventors: Kozo Nakamura, Kanagawa (JP); Junsuke Tomioka, Kanagawa (JP); Tetsuro Akagi, Kanagawa (JP); Shiro Yoshino, Kanagawa (JP)

(73) Assignee: Komatsu Denshi Kinzoku Kabushiki Kaisha, Kanagawa (JP)

( * ) Notice: Subject to any disclaimer, the term of this patent is extended or adjusted under 35 U.S.C. 154(b) by 1602 days.

(21) Appl. No.: 10/586,445

(22) PCT Filed: Jan. 27, 2005

(86) PCT No.: PCT/JP2005/001114
§ 371 (c)(1),
(2), (4) Date: Jul. 17, 2006

(87) PCT Pub. No.: WO2005/071144
PCT Pub. Date: Aug. 4, 2005

(65) Prior Publication Data
US 2009/0210166 A1     Aug. 20, 2009

(30) Foreign Application Priority Data
Jan. 27, 2004   (JP) .................. 2004-018313

(51) Int. Cl.
*C30B 29/06*     (2006.01)
(52) U.S. Cl. ................ 117/13; 117/17; 117/18; 117/20; 117/21

(58) Field of Classification Search ............ 117/13, 117/20, 21, 17, 18
See application file for complete search history.

(56) References Cited

FOREIGN PATENT DOCUMENTS

| JP | 02-263792 | 10/1990 |
|---|---|---|
| JP | 04-130732 | 5/1992 |
| JP | 04-174300 | 6/1992 |
| JP | 04-298042 | 10/1992 |
| JP | 05-102167 | 4/1993 |
| JP | 11-147789 | 6/1999 |
| JP | 2000-068280 | 3/2000 |
| JP | 2003-257983 | 9/2003 |
| JP | 2003-318181 | 11/2003 |

OTHER PUBLICATIONS

Hiroshi Takeno et al, articled entitled "Practical Computer Simulation Technique To Predict Oxygen Precipitation Behavior in Czochralski Silicon Wafers for Various Thermal Processes," (Journal of Electrochemical Society, 1997, vol. 144, No. 12, pp. 4340-4345 (the citation in ISR)).

Koji Sueoka et al., article entitled "Computer Simulation for Morphology, Size, and Density of Oxide Precipitates in CZ Silicon," (Journal of Electrochemical Society, 2003, vol. 150, pp. G469-G475.).

M. Schrems, article entitled "Simulation of Oxygen Precipitation," (Semiconductors and Semimetals, 1994, vol. 42, pp. 391-447) (Copyright © 1994 by Academic Press, Inc.).

*Primary Examiner* — Bob M Kunemund
(74) *Attorney, Agent, or Firm* — Husch Blackwell LLP (57) ABSTRACT

By specifying an initial oxygen concentration in a silicon single crystal and a concentration of thermal donors produced according to a thermal history from 400° C. to 550° C. that the silicon single crystal undergoes during crystal growth, a nucleation rate of oxygen precipitates produced in the silicon single crystal while the silicon single crystal is subjected to a heat treatment is determined. Further, by specifying the heat treatment condition of the silicon single crystal, an oxygen precipitate density and an amount of precipitated oxygen under a given heat treatment condition are predicted by calculation.

6 Claims, 6 Drawing Sheets

METHOD FOR PREDICTING PRECIPITATION BEHAVIOR OF OXYGEN IN SILICON SINGLE CRYSTAL, METHOD FOR DETERMINING PRODUCTION PARAMETER OF SILICON SINGLE CRYSTAL, AND STORAGE MEDIUM FOR STORING PROGRAM FOR PREDICTING PRECIPITATION BEHAVIOR OF OXYGEN IN SILICON SINGLE CRYSTAL

TECHNICAL FIELD

The present invention relates to a method for predicting the precipitation behavior of oxygen in a silicon single crystal for predicting the behavior of oxygen precipitates produced in a silicon single crystal in response to heat treatment, a method for determining a production parameter of a silicon single crystal which makes use of this method, and a storage medium for storing a program for predicting the precipitation behavior of oxygen in a silicon single crystal.

BACKGROUND ART

In the pulling method, a raw material, i.e., a silicon material in a solid state, is charged into a quartz-made crucible, and a melt of the raw material is generated by heating. At this time, oxygen which was present on the surface layer of the inner wall of the crucible and on the material surface and the like is mixed into the melt of the raw material. For this reason, oxygen on the order of $10 \times 10^{17}$ to $20 \times 10^{17}$ atoms/cm$^3$ (old ASTM designation) is incorporated into the silicon single crystal which is manufactured by the pulling method. The incorporated oxygen is supersaturated in the heat treatment process which is performed in the device manufacturing process, and precipitates in response to the heat treatment. Oxygen precipitates thus formed are microscopic defects, but are effective as gettering sites for impurities. The gettering which makes use of oxygen precipitates is particularly referred to as intrinsic gettering (hereafter referred to as "IG"), and is widely adopted as a gettering method for harmful heavy metals.

The IG capability for heavy metals is related to the density of oxygen precipitates and their size, i.e., the density of oxygen precipitates and the amount of precipitated oxygen. With respect to this relationship, for example, the below-described patent document 1 provides a disclosure concerning Fe, and the below-described patent documents 2 and 3 provide disclosures concerning Ni and Cu. Conventionally, the oxygen concentration in the silicon single crystal and a process are selected so that an appropriate IG capability can be obtained by the density of oxygen precipitates produced in the silicon single crystal and the amount of precipitated oxygen in response to the heat treatment provided to a wafer in the device manufacturing process.

The density of oxygen precipitates can be determined by the selective etching method. In addition, the amount of precipitated oxygen can be determined by obtaining a difference in the amount of infrared absorption of oxygen in solid solution before and after the heat treatment. However, the device manufacturing process in recent years has shifted from the conventional high-temperature process to a low-temperature process. Hence, with the conventional method, it has been difficult to evaluate the density of oxygen precipitates and the amount of precipitated oxygen.

The below-described patent document 4 discloses a method for indexing the density of oxygen precipitates and the amount of precipitated oxygen. This technique is a method in which the density of oxygen precipitates produced in the silicon single crystal and the amount of precipitation in the case where the silicon single crystal is subjected to heat treatment are determined by using three parameters including the initial oxygen concentration in the silicon single crystal, the dopant concentration or resistibility in the silicon single crystal, and the heat treatment condition to which the silicon single crystal is subjected. A similar method is also disclosed in the above-described patent documents 2 and 3. According to these methods, it is possible to evaluate the density of oxygen precipitates and the amount of precipitated oxygen in the low-temperature process.

The methods for predicting the density of oxygen precipitates and the amount of precipitation disclosed in the patent documents 2 to 4 are based on the following assumptions a) and b).

a) The nucleation of oxygen precipitates is a homogeneous nucleation process in which the driving force is derived from the free energy of supersaturated oxygen.

b) The nuclei produced in the homogeneous nucleation process grow in a diffusion-controlled process of oxygen.

Incidentally, it is conventionally well-known that the precipitation of oxygen is strongly dependent on the concentration of thermal donors generated according to a thermal history from 400° C. to 550° C. which the silicon single crystal undergoes during crystal growth. The thermal donor is an oxygen cluster consisting of several to several dozen oxygen atoms, and is electrically measured as a donor. The thermal donors are generated at temperatures between 400° C. and 550° C., and their formation rate is high particularly at temperatures between 450° C. and 500° C. The dwell time (thermal history) in this temperature range between 450° C. and 500° C. is reflected on the thermal donor concentration.

The fact that the thermal history between 400° C. and 550° C., i.e., the thermal donor concentration, determines the oxygen precipitation in the subsequent heat treatment process is disclosed, for example, in the following patent documents 5 to 9. These techniques concern the adjustment of the thermal history between 450° C. and 500° C., i.e., the thermal donor concentration, for obtaining preferred oxygen precipitation.

Patent document 1: Japanese Patent Application. Laid-Open No. 2003-257983
Patent document 2: Japanese Patent Application Laid-Open No. 2000-68280
Patent document 3: Japanese Patent Application Laid-Open No. 2003-318181
Patent document 4: Japanese Patent Application Laid-Open No. 11-147789
Patent document 5: Japanese Patent Application Laid-Open No. 2-263792
Patent document 6: Japanese Patent Application Laid-Open No. 4-130732
Patent document 7: Japanese Patent Application Laid-Open No. 4-298042
Patent document 8: Japanese Patent Application Laid-Open No. 4-175300
Patent document 9: Japanese Patent Application Laid-Open No. 5-102167

DISCLOSURE OF THE INVENTION

Problems to be Overcome by the Invention

The problem here is that the method for determining the density of oxygen precipitates and the amount of precipitated oxygen by calculation as in the aforementioned patent document 4 is unable to express the effect of the thermal donors on the oxygen precipitation. Namely, the problem lies in that despite the fact that the oxygen precipitation is dependent on the thermal donors, as described above, no consideration is given to the thermal donors in the patent document 4 and the like.

At present, there are no models available for theoretically explaining the relationship between the thermal donors and the oxygen precipitation, and a theoretical formula to be applied does not exist, so that calculation which takes its effect into consideration is not carried out. Since the conventional calculation methods for determining the density of oxygen precipitates and the amount of precipitated oxygen lack the most important element, their results of calculation are conceivably low in reliability. To compensate for the lowness of reliability, a quite laborious operation, such as the determination of conditions for leading to an appropriate state of oxygen precipitation for each heat treatment condition, is needed. Further, adjustment fitting parameters is needed for each heat treatment process. Then, a decline in the operating efficiency is unavoidable. Accordingly, the conventional methods for calculating oxygen precipitates lacked versatility.

The present invention has been devised in view of the above-described circumstances, and its object is to express the effect of thermal donors on the oxygen precipitation by reflecting the thermal donor concentration on the calculation method, to thereby improve the reliability concerning the prediction of oxygen precipitates.

Means for Solving the Problems

In accordance with a first aspect of the invention, there is provided a method for predicting a precipitation behavior of oxygen in a silicon single crystal for predicting the behavior of oxygen precipitates produced in the silicon single crystal in response to heat treatment, comprising:

performing a calculation by using as parameters an initial oxygen concentration in the silicon single crystal, a concentration of thermal donors generated according to a thermal history from 400° C. to 550° C. which the silicon single crystal undergoes during crystal growth, and a heat treatment condition to which the silicon single crystal is subjected; and determining a density of the oxygen precipitates produced in the silicon single crystal and an amount of precipitation in a case where the silicon single crystal is subjected to heat treatment.

In accordance with a second aspect of the invention, there is provided a method for predicting a precipitation behavior of oxygen in a silicon single crystal for predicting the behavior of oxygen precipitates produced in the silicon single crystal in response to heat treatment, comprising:

performing a calculation by using as parameters an initial oxygen concentration in the silicon single crystal and a concentration of thermal donors generated according to a thermal history from 400° C. to 550° C. which the silicon single crystal undergoes during crystal growth;

determining a nucleation rate of the oxygen precipitates produced in the silicon single crystal during a heat treatment process in a case where the silicon single crystal is subjected to heat treatment; and determining a density of the oxygen precipitates and an amount of precipitation by using the nucleation rate determined.

In accordance with a third aspect of the invention, there is provided a method for determining a production parameter of a silicon single crystal in which, in order to set a density of oxygen precipitates in the silicon single crystal and an amount of precipitation to desired values, an initial oxygen concentration in the silicon single crystal, a thermal history from 400° C. to 550° C. which an ingot of the silicon single crystal undergoes during crystal growth, and a heat treatment condition to which the silicon single crystal is subjected are determined by making use of the method for predicting the precipitation behavior of oxygen in the silicon single crystal according to claim 1 or 2.

In accordance with a fourth aspect of the invention, there is provided a storage medium for storing a program for predicting by a computer a behavior of oxygen precipitates produced in a silicon single crystal in response to heat treatment, wherein the storage medium stores the following processing as the program:

processing in which a calculation is performed by using as parameters an initial oxygen concentration in the silicon single crystal, a concentration of thermal donors generated according to a thermal history from 400° C. to 550° C. which the silicon single crystal undergoes during crystal growth, and a heat treatment condition to which the silicon single crystal is subjected; and processing in which a density of the oxygen precipitates produced in the silicon single crystal and an amount of precipitation are determined in a case where the silicon single crystal is subjected to heat treatment.

In accordance with a fifth aspect of the invention, there is provided a storage medium for storing a program for predicting by a computer a behavior of oxygen precipitates produced in a silicon single crystal in response to heat treatment, wherein the storage medium stores the following processing as the program:

processing in which a calculation is performed by using as parameters an initial oxygen concentration in the silicon single crystal and a concentration of thermal donors generated according to a thermal history from 400° C. to 550° C. which the silicon single crystal undergoes during crystal growth;

processing in which a nucleation rate of the oxygen precipitates produced in the silicon single crystal during a heat treatment process is determined in a case where the silicon single crystal is subjected to the heat treatment; and processing in which a density of the oxygen precipitates and an amount of precipitation are determined by using the determined nucleation rate.

Since there are no models available for theoretically explaining the relationship between the thermal donors and the oxygen precipitation, as described above, the present inventors conducted systematic experiments and clarified the behavior of oxygen precipitation by analyzing the results in detail. Although the present inventors showed in detail the effect of the thermal donor concentration on the amount of precipitated oxygen in the heat treatment at various temperatures, the present inventors investigated in greater detail these experimental samples for obtaining the present invention. In addition, although the above-described patent documents 6 and 7 provided the evaluation of only the amount of precipitated oxygen, the present inventors additionally conducted an evaluation of the density of oxygen precipitates. As a result, the following conclusions A) and B) were obtained.

A) The nucleation rate at each temperature is shown as a function of the oxygen concentration and the thermal donor concentration as expressed in the following formula (1). In formula (1) below, $I(t)$ is the nucleation rate $(cm^{-3}s^{-1})$; T is the temperature; $a(T)$ is a constant determined by the temperature; C is the oxygen concentration $(\times 10^{17} cm^{-3})$; and TD is the thermal donor concentration $(\times 10^{15} cm^{-3})$.

[Mathematical Formula 1]

$$I(T) = a(T)C^9 TD^{\frac{1}{3}} \quad (1)$$

B) The amount of precipitated oxygen can be calculated by applying a general growth formula which expresses the diffusion-controlled growth and annihilation of nuclei produced with the critical nuclear radius at each temperature. The thermal donor concentration can be obtained from a change in the resistibility before and after the donor annihilation heat treatment, and can also be obtained by using a prediction formula from the thermal history and the oxygen concentration between 400° C. to 550° C.

It can be said from A) and B) above that, by specifying the initial oxygen concentration in the silicon single crystal and the concentration of thermal donors generated according to a thermal history from 400° C. to 550° C. which the silicon single crystal undergoes during the crystal growth, it is possible to determine the nucleation rate of oxygen precipitates produced in the silicon single crystal in the process of heat treatment in a case where the silicon single crystal is subjected to heat treatment, and that, by specifying a heat treatment condition to which the silicon single crystal is subjected, the density of oxygen precipitates and the amount of precipitated oxygen under a given heat treatment condition can be predicted by calculation.

The above-described calculation method is programmed and stored in a storage medium. When parameters are entered and the program is executed, the above-described calculation is performed on a processor of the computer. By so doing, it is possible to improve the calculation efficiency and obtain accurate calculation results.

Effects of the Invention

According to the present invention, by calculating by using as parameters the oxygen concentration, the thermal donor concentration, and the heat treatment condition, it is possible to predict the density of oxygen precipitates and the amount of precipitated oxygen under a given heat treatment condition. Further, parameters of the manufacturing process of the silicon single crystal wafer are determined so that an oxygen precipitation state exhibiting an appropriate IG capability can be obtained by the heat treatment process which is carried out in the device manufacturing process. The reliability of the calculation result improves by calculating by using the most important element for oxygen precipitation, i.e., the element of the thermal donor concentration. For this reason, the laborious operation of determining a condition leading to an appropriate state of oxygen precipitation for each heat treatment condition in the conventional manner is not needed. Accordingly, the design of an appropriate silicon single crystal wafer for an arbitrary heat treatment process is facilitated without causing a decline in the operating efficiency.

BEST MODE FOR CARRYING OUT THE INVENTION

Hereafter, a description will be given of an embodiment of the present invention with reference to the drawings.

1. CONCERNING CALCULATION

First, a description will be given of the calculation for determining the density of the oxygen precipitates and the amount of precipitated oxygen. The calculation consists of the following steps 1) to 3).

1) The step in which the concentration of thermal donors generated in the silicon single crystal is determined from an initial oxygen concentration and a thermal history from 400° C. to 550° C. which an ingot of the silicon single crystal undergoes in the cooling process during the crystal growth 2) The step in which after dividing the heat treatment process into a plurality of time sections, the nucleation rate in each time section is determined from a nucleation rate formula using the initial oxygen concentration, the thermal donor concentration, and the temperature, and the density of nuclei produced in each time section is determined 3) The step of determining the growth and annihilation of nuclei produced in each time section It should be noted that oxygen precipitates are silicon-oxygen compounds of $SiO_2$.

[Concerning Step 1)]

First, a description will be given of the step 1) of determining the concentration of thermal donors. The thermal donor concentration of the silicon single crystal has a strong correlation with the oxygen concentration and the time required in the passage between 450° C. and 500° C. in the cooling process during the crystal growth, and can be obtained by using an empirical formula. However, it is preferable to determine the thermal donor concentration by the following method of calculation.

As a basic formula, a formula proposed in K. Wada, N. Inoue, Semiconductor Silicon, ed. H. R. Huff et al., (Electrochem. Soc., Pennington N. J., 1986) p. 778 was used. This formula is shown as in Formula (2) below. Formula (2) below shows the relationship between the heat treatment time and the thermal donor concentration under a fixed temperature condition, and shows that the thermal donor concentration TD is expressed by a function of the oxygen concentration C and the temperature (absolute temperature) T. In formula (2) below; TD is the thermal donor concentration; $TD^{eq}$ is the thermal equilibrium concentration of the thermal donor concentration; a is a coefficient ($=9.2 \times 10^{-50}$); k is a Boltzmann's constant; t is the absolute temperature; D is the diffusion constant of oxygen; C is the oxygen concentration; and t is the time.

[Mathematical Formula 2]

$$TD = TD^{eq}\{1 - \exp(-aDCt)\} \quad (2)$$

$$\text{where } TD^{eq} = aC^3 \exp\left(\frac{1.535 \text{ eV}}{kT}\right)$$

From the form of the formula, it can be seen that formula (2) above is a function which converges into $TD^{eq}$ with the time $t=\infty$. It should be noted that since formula (2) above is valid under the fixed temperature condition, the following measure was devised to adopt this formula under the condition of the cooling process during the crystal growth in which the temperature changes.

In the case where thermal donors are generated with the temperature change, the time t in formula (2) above must be converted to the effective time for each temperature. Here, a case is considered in which a heat treatment is carried out for a time $t_1$ (sec) at a temperature $T_1$, and after the thermal donor concentration becomes $TD_1$, a heat treatment is carried out for a time $t_2$ (sec) at a temperature $T_2$. In such a case, the amount (concentration) of thermal donors, TD1, generated at the temperature $T_1$ occurs at the temperature $T_2$, and that time $t_{12}$ is calculated. From formula (2) above, the time $t_{12}$ is shown as in formula (3) below.

[Mathematical Formula 3]

$$t_{12} = \frac{-\ln\left(1 - \frac{TD_1}{TD(T_2)^{eq}}\right)}{aDC} \quad (3)$$

Then, in the case where a heat treatment at the temperature $T_2$ for the time t (sec) is added, the amount (concentration) of generated thermal donors, TD, is conceivably shown as in formula (4) below.

[Mathematical Formula 3]

$$TD = TD(T_2)^{eq}\{1 - \exp(-aDC(t_{12}+t))\} \quad (4)$$

Figure 1:
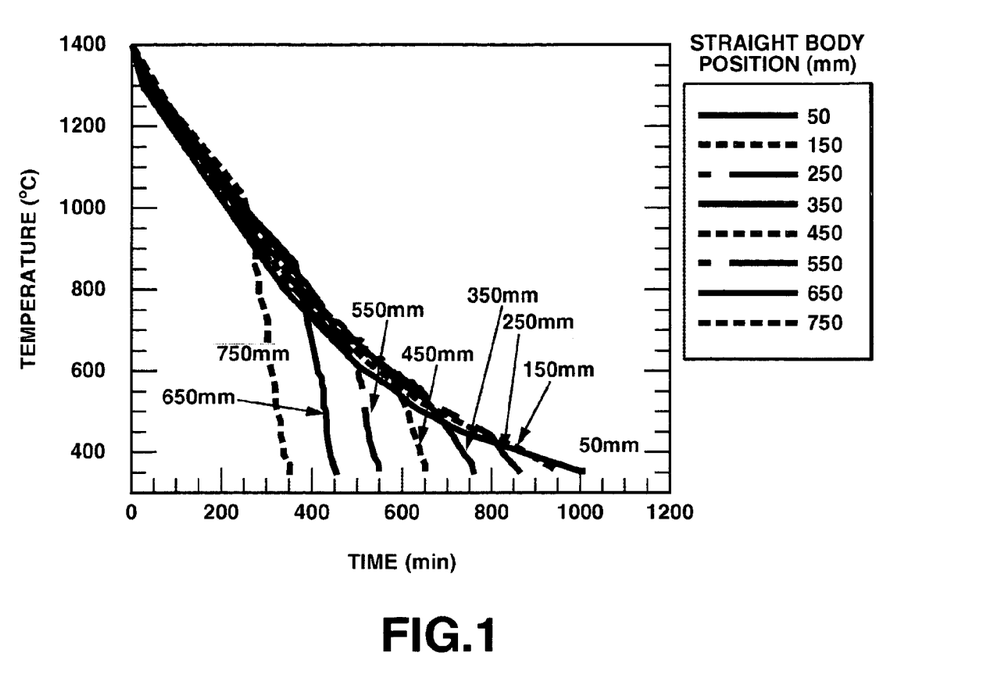
FIG. 1 is a diagram illustrating cooling curves at a straight body position in the crystal growth process of a silicon single crystal.

FIG. 1 is a diagram illustrating cooling curves at the straight body position in the crystal growth process of the silicon single crystal. FIG. 1 shows the cooling curves for a crystal with a diameter of 150 mm, and shows the cooling curves during the crystal growth at the straight body position spaced apart predetermined distances (50, 150, 250, 350, 450, 550, 650, and 750 mm) from the straight body starting position.

As shown in FIG. 1, the temperature of the silicon single crystal constantly continues to drop during the crystal growth. For this reason, the aforementioned calculation needs to be repeatedly carried out. Namely, the calculation is repeated in which a determination is made of the equivalent time $t_n$ in a case where the amount (concentration) of thermal donors, $TD_n$, generated up to a dropped temperature $T_n$ occurs at the temperature $T_n$, and the amount (concentration) of generated thermal donors, TD, is determined by adding a time increment by its time step $\Delta t$ portion to the equivalent time $t_n$. The generation of thermal donors is most active between 450° C. and 500° C., but the temperature range to be calculated should preferably be set to a wider range between 400° C. and 550° C.

Figure 2:
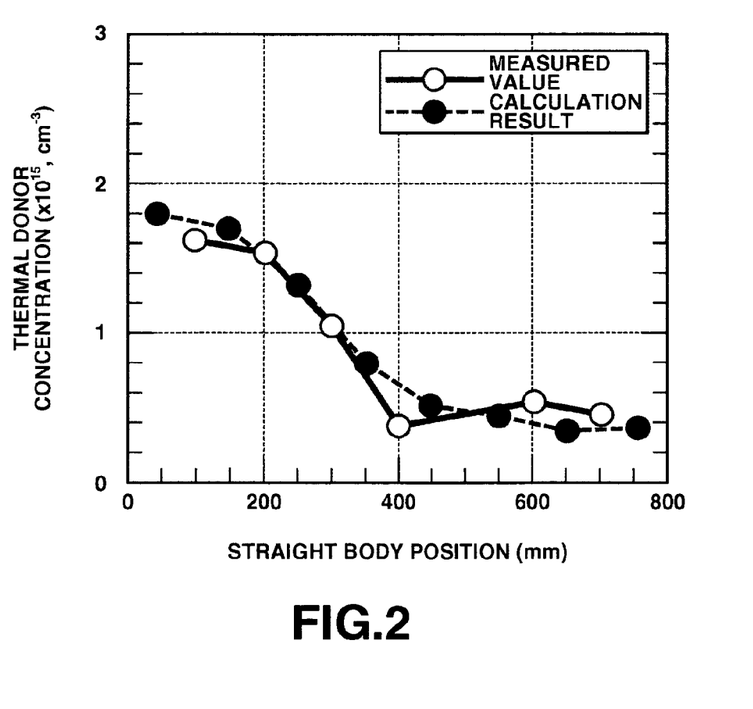
FIG. 2 is a diagram illustrating the thermal donor concentration determined by the calculation and the thermal donor concentration determined by actual measurement.

FIG. 2 is a diagram illustrating the thermal donor concentration determined by the calculation and the thermal donor concentration determined by actual measurement. The calculated values shown in FIG. 2 are thermal donor concentrations at each straight body position in the case where the above-described calculation method is applied to the thermal history shown in FIG. 1.

According to FIG. 2, it can be seen that errors between the calculated values and the measured values of the thermal donor concentration are very small. From this fact, it can be said that the above-described calculation method is able to predict the thermal donor concentration with high accuracy.

[Concerning Step 2)]

Next, a description will be given of the step 2) in which after dividing the heat treatment process into predetermined intervals, i.e., a plurality of time sections such as 5 seconds, the nucleation rate in each time section is determined from a nucleation rate formula using the initial oxygen concentration, the thermal donor concentration, and the temperature, and the density of nuclei produced in each time section is determined. The present inventors found that the nucleation rate at each temperature is expressed as a function of the oxygen concentration and the thermal donor concentration. The relationship is shown as in formula (5) below.

In formula (5) below, I(T, C, TD) is the nucleation rate $(cm^{-3}s^{-1})$; T is the temperature; a(T) is a constant determined by the temperature; C is the oxygen concentration $(\times 10^{17} cm^{-3})$; and TD is the thermal donor concentration $(\times 10^{15} cm^{-3})$.

[Mathematical Formula 5]

$$I(T, C, TD) = a(T)C^9 TD^{\frac{1}{3}} \quad (5)$$

A supplementary explanation will be given of formula (5) above.

Figure 3:
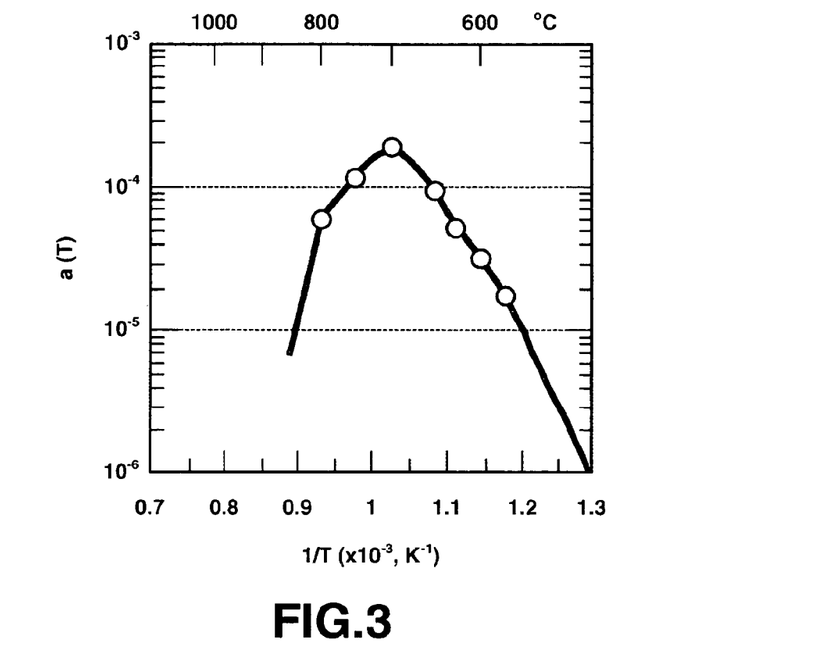
FIG. 3 is a diagram illustrating the relationship of correspondence between a coefficient and the temperature used in a formula for determined the nucleation rate of oxygen precipitates.

FIG. 3 is a diagram illustrating the relationship of correspondence between the coefficient and the temperature used in the formula for determined the nucleation rate of oxygen precipitates. The present inventors found that the coefficient a(T) which is determined by the temperature becomes a value shown in FIG. 3. Further, the thermal donor concentration TD used in formula (5) above is the as-grown concentration produced in the crystal growth process. In terms of their electrical properties, the thermal donors are annihilated during the temperature rise in the heat treatment, but their real effect remains, so that the as-grown concentration is used. Further, in a case where the process from 400° C. to 550° C. is also added in the heat treatment, the thermal donors generated during the heat treatment are also included in it. The characteristic feature of the present invention lies in that the nucleation rate of oxygen precipitates is shown by the aforementioned formula (5), and that the effect of the thermal donors is applied for the first time in the calculation and prediction.

The density of nuclei N(t') generated with the lapse of $\Delta t$ from the time t' is shown as in formula (6) below.

[Mathematical Formula 6]

$$N(t') = I(T,C,TD)\Delta t \quad (6)$$

The radius of the generated nuclei is assumed to be the critical nuclear radius shown by formula (7) below. In formula (7) below, Rcri is the critical nuclear radius; V is the molecular volume of $SiO_2$; $\sigma$ is the interfacial energy between Si and $SiO_2$; C is the oxygen concentration; and $C^{eq}$ is the thermal equilibrium concentration of oxygen.

[Mathematical Formula 7]

$$Rcri = \frac{V\sigma}{kT\ln\left(\frac{C}{C^{eq}}\right)} \quad (7)$$

Data on the nuclei for each time section produced with the density and the size shown in formulae (6) and (7) above are recorded in the memory, and the growth and annihilation of the respective nuclei are calculated.

[Concerning Step 3)]

Next, a description will be given of the step 3) of determining the growth and annihilation of nuclei produced in each time section. The growth rate in the time t of nuclei generated with the lapse of $\Delta t$ from the time t' is shown as in formula (8) below. In formula (8) below, R(t', t) is the radius in the time t of the nuclei produced with the lapse of $\Delta t$ from the time t'; and Ci is the equilibrium oxygen concentration at the interface of spherical particles with a radius R.

[Mathematical Formula 8]

$$\frac{\partial R(t', t)}{\partial t} = \frac{DV}{2R(t', t)}(C - Ci) \quad (8)$$

where $Ci = C^{eq} \exp\left(\frac{V\sigma}{RkT}\right)$

It is possible to determined R(t', t) by a calculation using formula (8) above. Since the change in the oxygen concentration in the silicon single crystal is shown as in formula (9) below, the amount of precipitated oxygen can be determined by the calculation. Since the oxygen concentration decreases by the amount of precipitated oxygen, the residual oxygen concentration can be determined as a difference in the amount of precipitated oxygen determined by using formula (9) below from the initial oxygen concentration. Calculation processing is repeated in which the residual oxygen concentration is determined for each time section, the nucleation rate of oxygen precipitates is determined, and the growth of oxygen precipitates is determined.

[Mathematical Formula 9]

$$\frac{\partial C}{\partial t} = -4\pi D \int_{t'=0}^{t'=t} N(t') R(t', t)(C - Ci) dt' \quad (9)$$

By applying the above-described calculation to the heat treatment process, it is possible to determine the density and the size of the oxygen precipitates as well as the size distribution and the amount of precipitated oxygen. Specifically, the above-described calculation method is programmed and stored in a storage medium. When parameters are inputted and the program is executed, the above-described calculation is performed by a processor of a computer. By so doing, it is possible to improve the calculation efficiency and obtain accurate calculation results.

On the other hand, in order to set the density of oxygen precipitates and the amount of precipitated oxygen to desired values, it suffices if the parameters of the heat treatment process used in the calculation are adjusted.

2. EXAMPLES

Next, specific examples of the present invention will be shown. It should be noted that the present invention should not be limited to the same.

Example 1

As Example 1, verification was made of the prediction of precipitation behavior of oxygen in accordance with the invention with respect to a typical heat treatment process. In the heat treatment conducted, wafers were charged into a furnace at a set temperature and were held.

The silicon single crystal used was a P-type crystal with a diameter of 150 mm whose oxygen concentration was $11 \times 10^{17}$ to $17 \times 10^{17}$ atoms/cm$^3$ (old ASTM designation), and whose thermal donor concentration in the as-grown state was $1 \times 10^{14}$ to $2 \times 10^{15}$ cm$^{-3}$. Hereafter, of the heat treatment processes, the process below 800° C. in which nucleation occurs actively will be referred to as the nucleation heat treatment, and the process above 800° C. in which the growth of nuclei mainly occurs will be referred to as the growth heat treatment. Under the various conditions shown below, the present inventors carried out the nucleation heat treatment, followed by the growth heat treatment, and measured the density of oxygen precipitates and the amount of precipitated oxygen.

First, the nucleation heat treatment was carried out under the conditions in which the following temperatures and time were combined.

Temperature: 575, 600, 625, 650, 700, and 750° C.
Time: 0, 0.5, 2, and 4 hrs.

Next, the growth heat treatment was provided under the following three conditions.

Growth heat treatment 1: 4 hrs. at 800° C.+16 hrs. at 1000° C.

Growth heat treatment 2: 4 hrs. at 900° C.+16 hrs. at 1000° C.

Growth heat treatment 3: 16 hrs. at 1000° C.

First, a comparison is made between the measured values and calculated values with respect to the amount of precipitated oxygen of the oxygen precipitates.

Figure 5:
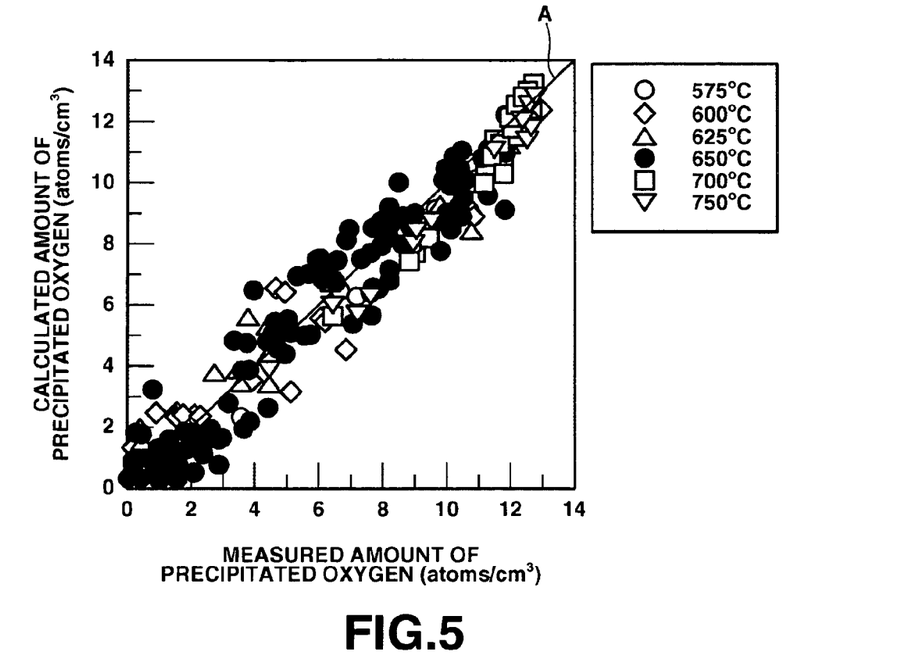
FIG. 5 is a diagram illustrating measured values and calculated values of the amount of precipitated oxygen in a case where the growth heat treatment was added for 4 hours at 900° C. plus for 16 hours at 1000° C. after carrying out the nucleation heat treatment.
Figure 6:
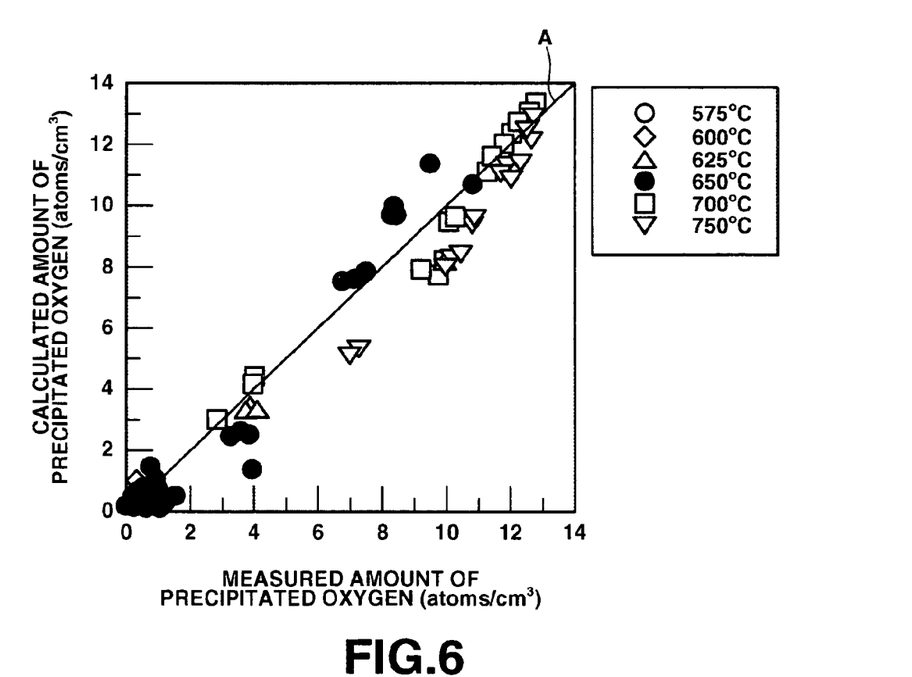
FIG. 6 is a diagram illustrating measured values and calculated values of the amount of precipitated oxygen in a case where the growth heat treatment was added for 16 hours at 1000° C. after carrying out the nucleation heat treatment.

The measured values were determined by obtaining a difference in the amount of infrared absorption of oxygen in solid solution before and after the heat treatment. In addition, calculation values were determined by the calculation in accordance with the invention. The results are shown in FIGS. 4, 5, and 6.

Figure 4:
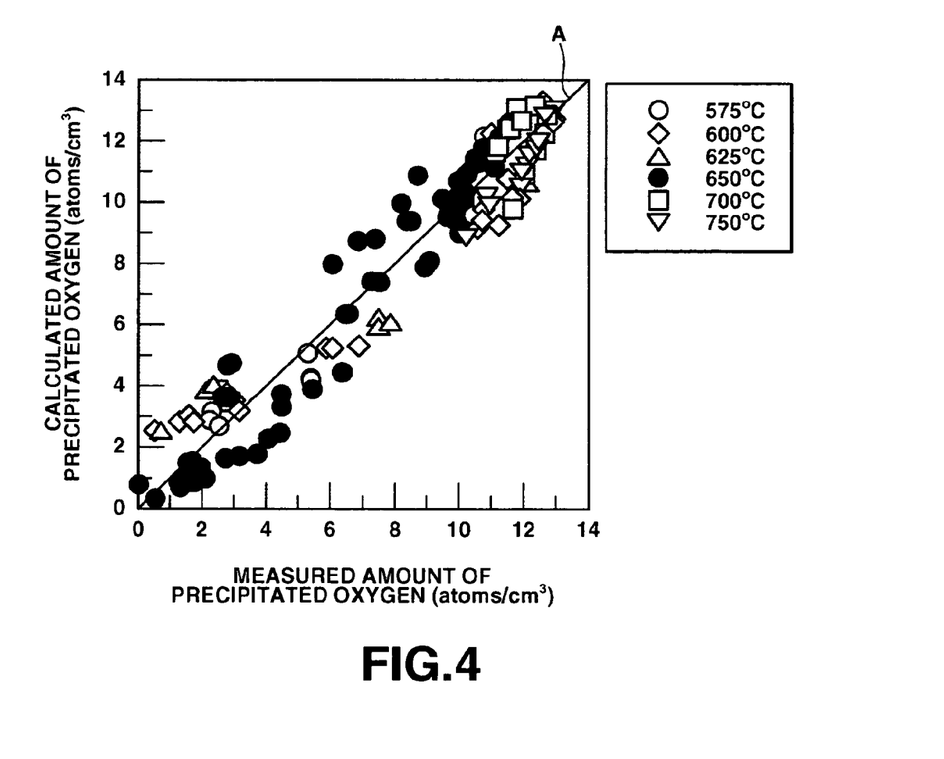
FIG. 4 is a diagram illustrating measured values and calculated values of the amount of precipitated oxygen in a case where growth heat treatment was added for 4 hours at 800° C. plus for 16 hours at 1000° C. after carrying out nucleation heat treatment.

FIG. 4 is a diagram illustrating measured values and calculated values of the amount of precipitated oxygen in the case where the above-described growth heat treatment 1 was added after carrying out the above-described nucleation heat treatment. FIG. 5 is a diagram illustrating measured values and calculated values of the amount of precipitated oxygen in the case where the above-described growth heat treatment 2 was added after carrying out the above-described nucleation heat treatment. FIG. 6 is a diagram illustrating measured values and calculated values of the amount of precipitated oxygen in the case where the above-described growth heat treatment 3 was added after carrying out the above-described nucleation heat treatment. In each diagram, the abscissa is the measured value, and the ordinate is the calculated value. It can be said that in each diagram the closer to a straight line A the distribution is obtained, the smaller is the difference between the measured value and the calculated value. In FIGS. 4, 5, and 6, the calculated values and the measured values of the amount of precipitated oxygen substantially agree, and distributions close to the straight line A are obtained. From this result, it can be appreciated that the accuracy of the calculation in accordance with the invention is high.

Next, a comparison is made between the measured values and calculated values with respect to the density of the oxygen precipitates.

Figure 8:
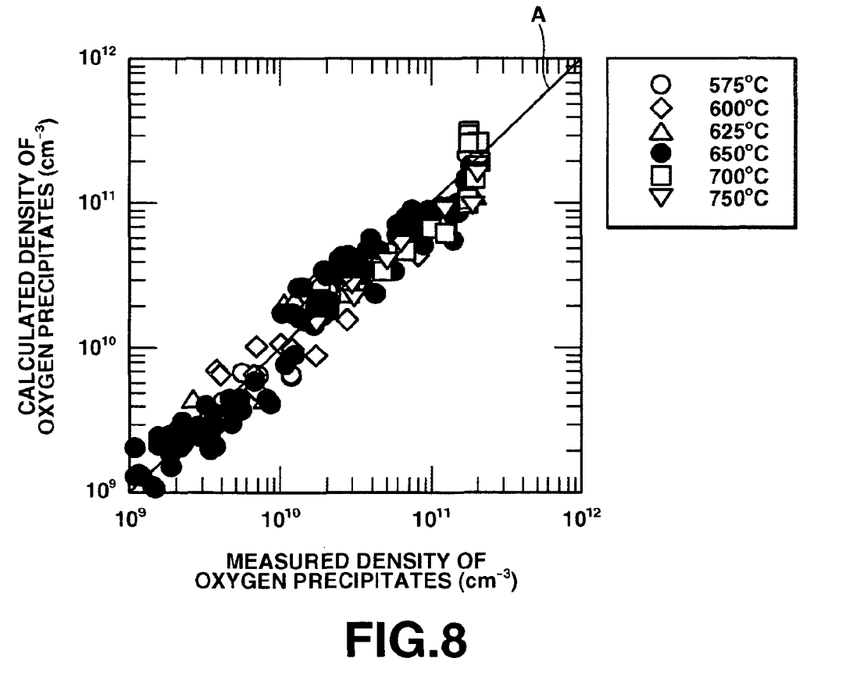
FIG. 8 is a diagram illustrating measured values and calculated values of the density of oxygen precipitates in a case where the growth heat treatment was added for 4 hours at 900° C. plus for 16 hours at 1000° C. after carrying out the nucleation heat treatment.
Figure 9:
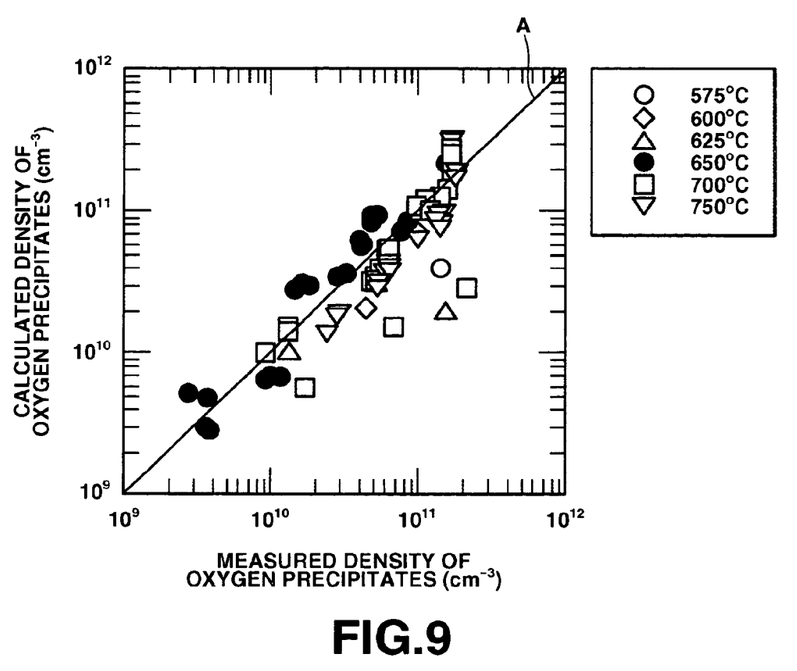
FIG. 9 is a diagram illustrating measured values and calculated values of the density of oxygen precipitates in a case where the growth heat treatment was added for 16 hours at 1000° C. after carrying out the nucleation heat treatment.

The measured values were determined by the selective etching method. In addition, calculation values were determined by the calculation in accordance with the invention. The results are shown in FIGS. 7, 8, and 9.

Figure 7:
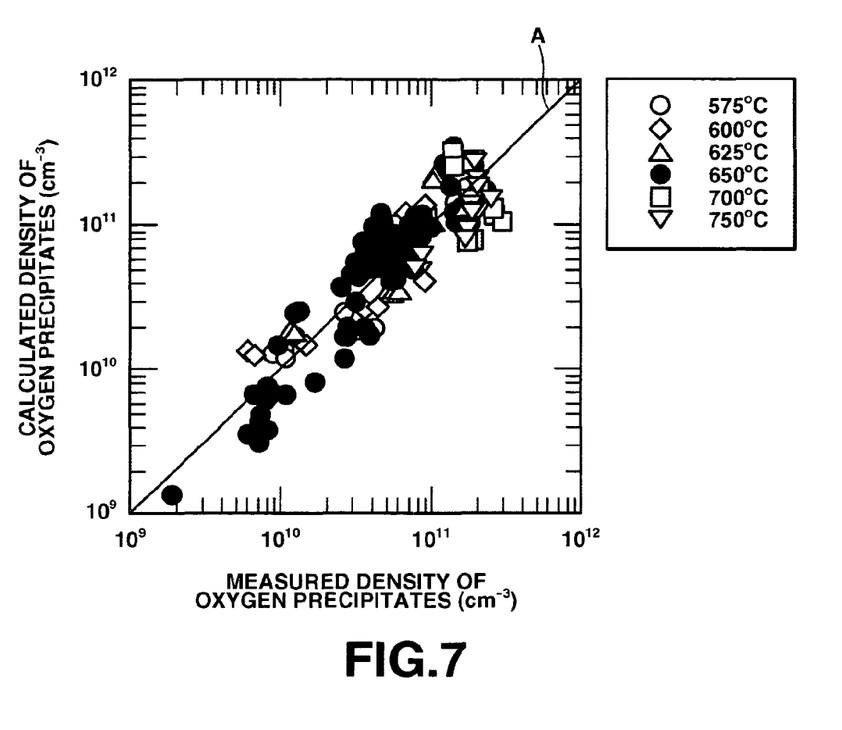
FIG. 7 is a diagram illustrating the density of oxygen precipitates and calculated values thereof in a case where the growth heat treatment was added for 4 hours at 800° C. plus for 16 hours at 1000° C. after carrying out the nucleation heat treatment.

FIG. 7 is a diagram illustrating measured values and calculated values of the density of the oxygen precipitates in the case where the above-described growth heat treatment 1 was added after carrying out the above-described nucleation heat treatment. FIG. 8 is a diagram illustrating measured values and calculated values of the density of the oxygen precipitates in the case where the above-described growth heat treatment 2 was added after carrying out the above-described nucleation heat treatment. FIG. 9 is a diagram illustrating measured values and calculated values of the density of the oxygen precipitates in the case where the above-described growth heat treatment 3 was added after carrying out the above-described nucleation heat treatment. In each diagram, the abscissa is the measured value, and the ordinate is the calculated value. It can be said that in each diagram the closer to a straight line A the distribution is obtained, the smaller is the difference between the measured value and the calculated value. In FIGS. 7, 8, and 9, the calculated values and the measured values of the density of the oxygen precipitates substantially agree, and distributions close to the straight line A are obtained. From this result, it can be appreciated that the accuracy of the calculation in accordance with the invention is high.

The above-described patent document 6 by the present inventors discloses a method for predicting the amount of precipitated oxygen. However, the disclosure of the above-described patent document 6 is limited to the growth heat treatment under the three conditions, and is a method for determining the amount of precipitated oxygen by multivariate analysis. Accordingly, this method could not be applied to a wide range of heat treatment conditions, and lacked versatility. Furthermore, no information was obtained concerning the density and average size of oxygen precipitates.

According to the invention, it is possible to predict the density of oxygen precipitates together with the amount of precipitated oxygen with excellent accuracy. This means that it is also possible to predict the average number of oxygen atoms constituting the oxygen precipitates, i.e., the average size of the oxygen precipitates.

Example 2

As Example 2, verification was made of the prediction of precipitation behavior of oxygen in accordance with the invention with respect to a heat treatment process different from Example 1, and the versatility of the present invention was confirmed. In the heat treatment conducted, wafers were charged into a low-temperature furnace, and were slowly heated to a set temperature.

The silicon single crystal used was a P-type crystal with a diameter of 200 mm whose oxygen concentration was $11.2 \times 10^{17}$ to $13.5 \times 10^{17}$ atoms/cm$^3$ (old ASTM designation). In the heat treatment conducted in this example, the wafers were charged into a 500° C. furnace, and the temperature was raised at a rate of 1° C./min. after the charging. Then, as the end-point temperature, four temperatures of 650, 700, 750, and 800° C. were set, and after the in-furnace temperature reached the set temperature, the respective temperatures were maintained for 4 hours. After the wafers were subjected to such nucleation heat treatment, the growth heat treatment was added for 3 hours at 780° C. plus for 16 hours at 1000° C., and the density of oxygen precipitates and the amount of precipitated oxygen were measured.

First, a comparison is made between the measured values and calculated values with respect to the amount of precipitated oxygen of the oxygen precipitates.

The method of measurement and the method of calculation are identical to those of Example 1. The results are shown in FIG. 10.

Figure 10:
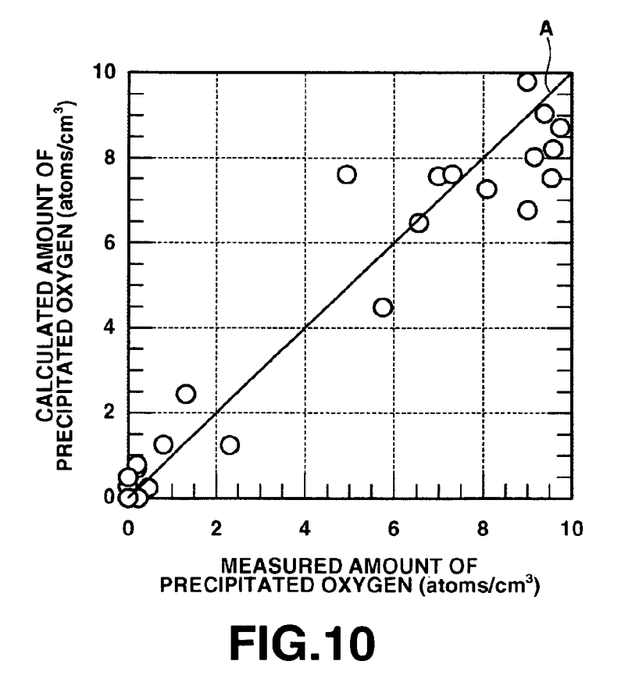
FIG. 10 is a diagram illustrating measured values and calculated values of the amount of precipitated oxygen in a case where the growth heat treatment was added for 3 hours at 780° C. plus for 16 hours at 1000° C. after carrying out the nucleation heat treatment.

FIG. 10 is a diagram illustrating measured values and calculated values of the amount of precipitated oxygen in the case where the growth heat treatment was added after carrying out the nucleation heat treatment. In the same way as FIGS. 4 to 6, in FIG. 10, the abscissa is the measured value, and the ordinate is the calculated value. It can be said that in the diagram the closer to the straight line A the distribution is obtained, the smaller is the difference between the measured value and the calculated value. In FIG. 10, the calculated values and the measured values of the density of the oxygen precipitates substantially agree, and a distribution close to the straight line A is obtained. From this result, it can be appreciated that the accuracy of the calculation in accordance with the invention is high.

Next, a comparison is made between the measured values and calculated values with respect to the density of the oxygen precipitates.

The method of measurement and the method of calculation are identical to those of Example 1. The results are shown in FIG. 11.

Figure 11:
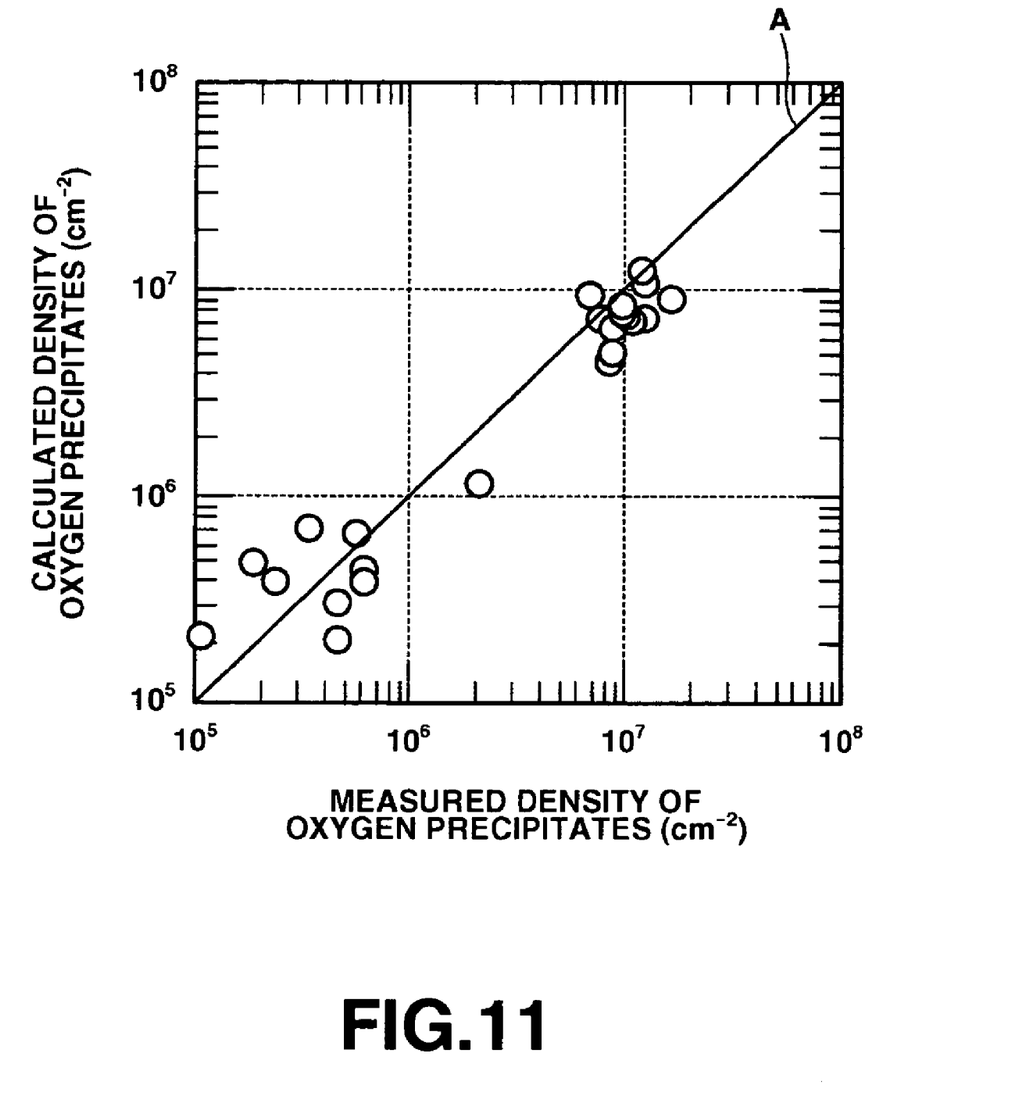
FIG. 11 is a diagram illustrating measured values and calculated values of the density of oxygen precipitates in a case where the growth heat treatment was added for 3 hours at 780° C. plus for 16 hours at 1000° C. after carrying out the nucleation heat treatment.

FIG. 11 is a diagram illustrating measured values and calculated values of the density of the oxygen precipitates in the case where the growth heat treatment was added after carrying out the nucleation heat treatment. In the same way as FIGS. 7 to 9, in FIG. 11, the abscissa is the measured value, and the ordinate is the calculated value. It can be said that in the diagram the closer to the straight line A the distribution is obtained, the smaller is the difference between the measured value and the calculated value. In FIG. 11, the calculated values and the measured values of the density of the oxygen precipitates substantially agree, and a distribution close to the straight line A is obtained. From this result, it can be appreciated that the accuracy of the calculation in accordance with the invention is high.

According to the invention, it is possible to predict the density of oxygen precipitates together with the amount of precipitated oxygen with excellent accuracy. This means that it is also possible to predict the average number of oxygen atoms constituting the oxygen precipitates, i.e., the average size of the oxygen precipitates.

The invention claimed is:

1. A method for predicting a precipitation behavior of oxygen in a silicon single crystal for predicting behavior of oxygen precipitates produced in the silicon single crystal in response to heat treatment, comprising:

dividing a heat treatment process into a plurality of time segments;

determining a nucleation rate I (T, C, TD) of the oxygen precipitates in each time segment from a nucleation rate formula, $$I(T,C,TD)=a(T)C^9 TD^{1/3}$$

wherein I (T, C, TD) is the nucleation rate (cm$^{-3}$ s$^{-1}$), C is an oxygen concentration ($\times 10^{17}$ cm$^{-3}$), TD is a thermal donor concentration ($\times 10^{15}$ cm$^{-3}$), T is a temperature; a(T) is a constant determined by the temperature; and determining a density of nuclei N(t') of the oxygen precipitates produced during a period Δt that begins at the time t', from a formula, $$N(t')=I(T,C,TD)\Delta t.$$

2. The method according to claim 1, further comprising:

determining a growth rate R(t',t) in time t of nuclei of the oxygen precipitates produced during the period Δt that begins at time t', form a formula, $$\frac{\partial R(t',t)}{\partial t} = \frac{DV}{2R(t',t)}(C - Ci)$$

In which $$Ci = C^{eq} \exp\left(\frac{V\sigma}{RkT}\right)$$

wherein R(t', t) is a radius in the time t of the nuclei of the oxygen precipitates produced during the period Δt that begins at time t', and Ci is an equilibrium oxygen concentration at an interface of spherical particles with a radius R, and determining an amount of precipitated oxygen from a formula, $$\frac{\partial C}{\partial t} = -4\pi D \int_{t'=0}^{t'=t} N(t')R(t',t)(C-Ci)dt'.$$

3. The method according to claim 1, further comprising:

determining the thermal donor concentration TD at the temperature $T_2$ from 400° C. to 550° C. which the silicon single crystal undergoes during crystal growth, from a formula, $$TD=TD(T_2)^{eq}\{1-\exp(-aDC(t_{12}+t))\}$$

wherein TD is the thermal donor concentration ($\times 10^{15}$ cm$^{-3}$), TD$^{eq}$ is a thermal equilibrium concentration of the thermal donor concentration, a is a coefficient (=9.0× 10$^{-50}$), k is a Boltzmann's constant, D is a diffusion constant of oxygen, C is the oxygen concentration, t is the time, and $t_{12}$ is an equivalent time required for generation at the constant temperature $T_2$ of an amount of thermal donors generated during cooling to the temperature $T_2$.

4. A storage medium for storing a program for predicting by a computer a behavior of oxygen precipitates produced in a silicon single crystal in response to heat treatment, wherein the storage medium stores the following processing as the program:

processing in which a heat treatment process is divided into a plurality of time segments, and a nucleation rate I(T, C, TD) of the oxygen precipitates in each time segment is determined from a nucleation rate formula:

$$I(T,C,TD)=a(T)C^9 TD^{1/3}$$

wherein I(T, C, TD) is the nucleation rate (cm$^{-3}$s$^{-1}$), C is an oxygen concentration ($\times 10^{17}$ cm$^{-3}$), TD is a thermal donor concentration ($\times 10^{15}$ cm$^{-3}$), T is a temperature: a(T) is a constant determined by the temperature; and processing in which a density of nuclei N(t') of the oxygen precipitates produced during a period Δt that begins at time t', is determined from a formula, $$N(t')=I(T,C,TD)\Delta t.$$

5. The storage medium for storing a program according to claim 4, wherein the storage medium further stores the following processing as the program:

processing in which a growth rate R(t',t) in time t of the nuclei of the oxygen precipitates produced during the period Δt that begins at time t', is determined from a formula, $$\frac{\partial R(t',t)}{\partial t} = \frac{DV}{2R(t',t)}(C - Ci)$$

In which $$Ci = C^{eq} \exp\left(\frac{V\sigma}{RkT}\right)$$

wherein R(t',t) is a radius in the time t of the nuclei of the oxygen precipitates produced during the period Δt that begins at time t', and Ci is an equilibrium oxygen concentration at an interface of spherical particles with a radius R; and processing in which an amount of precipitated oxygen is determined from a formula, $$\frac{\partial C}{\partial t} = -4\pi D \int_{t'=0}^{t'=t} N(t')R(t',t)(C-Ci)dt'.$$

6. The storage medium for storing a program according to claim 4, wherein the storage medium further stores the following processing as the program:

processing in which the thermal donor concentration TD at the temperature $T_2$ from 400° C. to 550° C. which the silicon single crystal undergoes during crystal growth, is determined from a formula, $$TD=TD(T_2)^{eq}\{1-\exp(-aDC(t_{12}+t))\}$$

wherein TD is the thermal donor concentration ($\times 10^{15}$ cm$^{-3}$), $TD^{eq}$ is a thermal equilibrium concentration of the thermal donor concentration, a is a coefficient ($=9.0\times10^{-50}$), k is a Boltzmann's constant, D is a diffusion constant of oxygen, C is the oxygen concentration, t is the time, and $t_{12}$ is an equivalent time required for generation at the constant temperature $T_2$ of an amount of thermal donors generated during cooling to the temperature $T_2$ occurs.

\* \* \* \* \*